(12) United States Patent
Matsunami

(10) Patent No.: US 9,196,343 B2
(45) Date of Patent: Nov. 24, 2015

(54) NON-VOLATILE SEMICONDUCTOR MEMORY DEVICE

(75) Inventor: Junya Matsunami, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 697 days.

(21) Appl. No.: 13/424,499

(22) Filed: Mar. 20, 2012

(65) Prior Publication Data

US 2013/0088910 A1    Apr. 11, 2013

(30) Foreign Application Priority Data

Oct. 11, 2011   (JP) .................. 2011-224201

(51) Int. Cl.
| | | |
|---|---|---|
| G11C 11/00 | (2006.01) | |
| G11C 11/22 | (2006.01) | |
| G11C 13/00 | (2006.01) | |

(52) U.S. Cl.
CPC ............ G11C 11/22 (2013.01); G11C 13/0004 (2013.01); G11C 13/0007 (2013.01); G11C 13/0011 (2013.01); G11C 13/0016 (2013.01); G11C 13/0026 (2013.01); G11C 13/0038 (2013.01); G11C 2013/0083 (2013.01)

(58) Field of Classification Search
CPC .............. G11C 13/0002; G11C 11/14; G11C 13/0004; G11C 13/0069; G11C 13/0038; G11C 13/004
USPC ............ 365/148, 163, 158, 171, 173
See application file for complete search history.

(56) References Cited

U.S. PATENT DOCUMENTS

| | | | | |
|---|---|---|---|---|
| 7,310,255 | B2 | 12/2007 | Chan | |
| 8,040,715 | B2 * | 10/2011 | Takase | 365/148 |
| 2002/0126524 | A1 * | 9/2002 | Sugibayashi et al. | 365/158 |
| 2010/0124097 | A1 * | 5/2010 | Takase | 365/148 |
| 2010/0328999 | A1 * | 12/2010 | Higo et al. | 365/171 |

FOREIGN PATENT DOCUMENTS

| | | |
|---|---|---|
| JP | 2006-134398 | 5/2006 |
| JP | 2006-202411 | 8/2006 |
| JP | 2010-211895 | 9/2010 |
| JP | 2010-225221 | 10/2010 |

OTHER PUBLICATIONS

Office Action issued Aug. 5, 2014 in Japanese Patent Application No. 2011-224201 (with English translation).

* cited by examiner

*Primary Examiner* — Han Yang
(74) *Attorney, Agent, or Firm* — Oblon, McClelland, Maier & Neustadt, L.L.P.

(57) ABSTRACT

A non-volatile semiconductor memory device according to an embodiment includes a memory cell array including first lines, second lines, and memory cells each including a variable resistor and each connected between one of the first lines and one of the second lines, and a control circuit configured to perform a voltage application operation of applying a first voltage to a selected first line connected to a selected memory cell and applying a second voltage having a voltage value lower than the first voltage to a selected second line connected to the selected memory cell. The control circuit is configured to select the voltage value of the second voltage from among a plurality of different voltage values and output the second voltage.

16 Claims, 12 Drawing Sheets

NON-VOLATILE SEMICONDUCTOR MEMORY DEVICE

CROSS REFERENCE TO RELATED APPLICATION

This application is based upon and claims the benefit of priority from prior Japanese Patent Application No. 2011-224201, filed on Oct. 11, 2011, the entire contents of which are incorporated herein by reference.

BACKGROUND

1. Field

Embodiments described herein relate to a non-volatile semiconductor memory device.

2. Description of the Related Art

In recent years, resistance change memory (ReRAM) in which a variable resistor is employed in a memory cell have been proposed. An operation of writing data in a memory cell is performed by applying a certain set voltage to a variable resistor. This causes the variable resistor to transition from a high resistance state to a low resistance state. Hereinafter, an operation to change the variable resistor from the high resistance state to the low resistance state is referred to as a "set operation". An operation of erasing data from a memory cell MC is performed by applying a reset voltage to the variable resistor, which remains in the low resistance state after the set operation, in an opposite direction to a direction in the set operation. This causes the variable resistor to transition from the low resistance state to the high resistance state. Hereinafter, an operation to change the variable resistor from the low resistance state to the high resistance state is referred to as a "reset operation".

In resistance change memory, when the resistance values of the variable resistors disperse during the set operation or the reset operation, it is difficult to store accurate data in memory cells. For this reason, in resistance change memory, it is necessary to suppress the dispersion of the resistance values of the variable resistors during the set operation and the reset operation.

DETAILED DESCRIPTION

A non-volatile semiconductor memory device according to an embodiment includes a memory cell array including first lines, second lines, and memory cells each including a variable resistor and each connected between one of the first lines and one of the second lines, and a control circuit configured to perform a voltage application operation of applying a first voltage to a selected first line connected to a selected memory cell and applying a second voltage having a voltage value lower than the first voltage to a selected second line connected to the selected memory cell. The control circuit is configured to select the voltage value of the second voltage from among a plurality of different voltage values and output the second voltage.

Next, embodiments of the present invention will be described in detail with reference to the accompanying drawings.

First Embodiment

Entire Configuration

Figure 1:
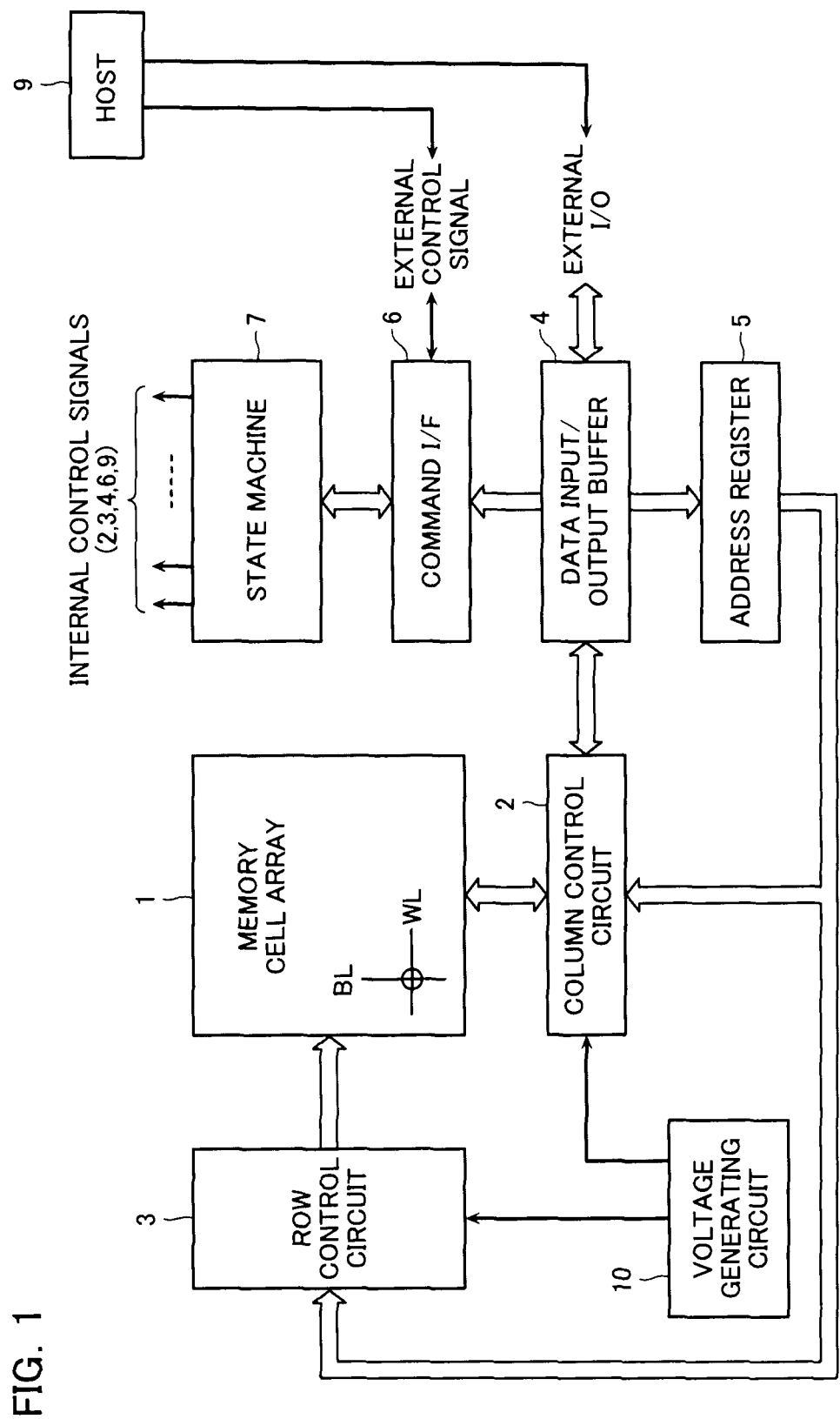
FIG. 1 is a block diagram of a non-volatile semiconductor memory device according to an embodiment of the present invention.

FIG. 1 is a block diagram of a non-volatile memory according to a first embodiment of the present invention. The non-volatile memory includes a memory cell array 1 in which memory cells each including a variable resistor are arranged in the form of a matrix. A column control circuit 2 is provided at the position adjacent to the memory cell array 1 in a bit line BL direction. The column control circuit 2 controls a bit line BL of the memory cell array 1, and performs an operation of erasing data from a memory cell, an operation of writing data to a memory cell, and an operation of reading data from a memory cell.

A row control circuit 3 is provided at the position adjacent to the memory cell array 1 in a word line WL direction. The row control circuit 3 selects the word line WL of the memory cell array 1, and applies a voltage necessary for an operation of erasing data from a memory cell, an operation of writing data to a memory cell, and an operation of reading data from a memory cell.

A data input/output buffer 4 is connected to an external host 9 through an input/output (I/O) line. The I/O buffer 4 receives write data, an erase command, address data, and a command data, and outputs read data. The data input/output buffer 4 transfers received write data to the column control circuit 2, receives data read from the column control circuit 2, and outputs the data to the outside. An address supplied to the data input/output buffer 4 from the outside is transferred to the column control circuit 2 and the row control circuit 3 through an address register 5.

A command supplied from the host 9 to the data input/output buffer 4 is transferred to a command interface 6. The command interface 6 receives an external control signal from the host 9, and determines whether data input to the data input/output buffer 4 is write data, a command, or an addresses. When the input data is a command, the command interface 6 transfers the command to a state machine 7 as a received command signal.

The state machine 7 controls the entire non-volatile memory. The state machine 7 receives a command from the host 9 through the command interface 6 and performs a read operation, a write operation, an erase operation, data input/output control, and the like. The external host 9 can receive status information managed by the state machine 7 and determine an operation result. The status information is also used for control of a write operation and an erase operation.

A voltage generating circuit 10 is controlled by the state machine 7. Based on this control, the voltage generating circuit 10 can output an arbitrary voltage and an arbitrary timing pulse.

The generated pulse may be transferred to an arbitrary line selected by the column control circuit 2 and the row control circuit 3. A peripheral circuit element other than the memory cell array 1 may be formed on a silicon substrate directly below the memory cell array 1 formed at a wiring layer. This allows a chip area of the non-volatile memory to be almost equal to an area of the memory cell array 1.

[Memory Cell Array and Peripheral Circuit Thereof]

Figure 2:
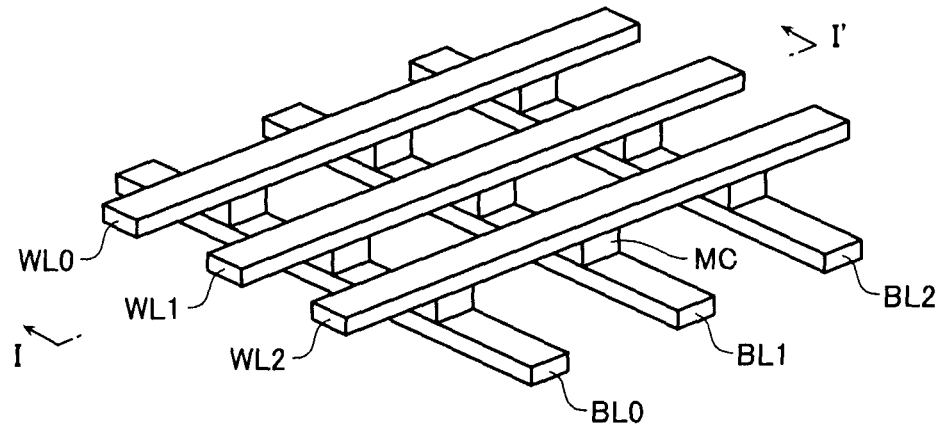
FIG. 2 is a partial perspective view illustrating a part of a memory cell array 1.
Figure 3:
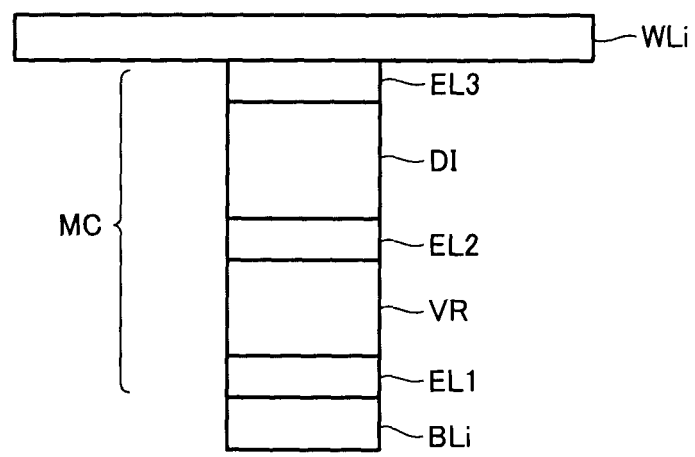
FIG. 3 is a cross-sectional view, taken along line I-I' of FIG. 2, corresponding to one memory cell viewed in an arrow direction.
Figure 4:
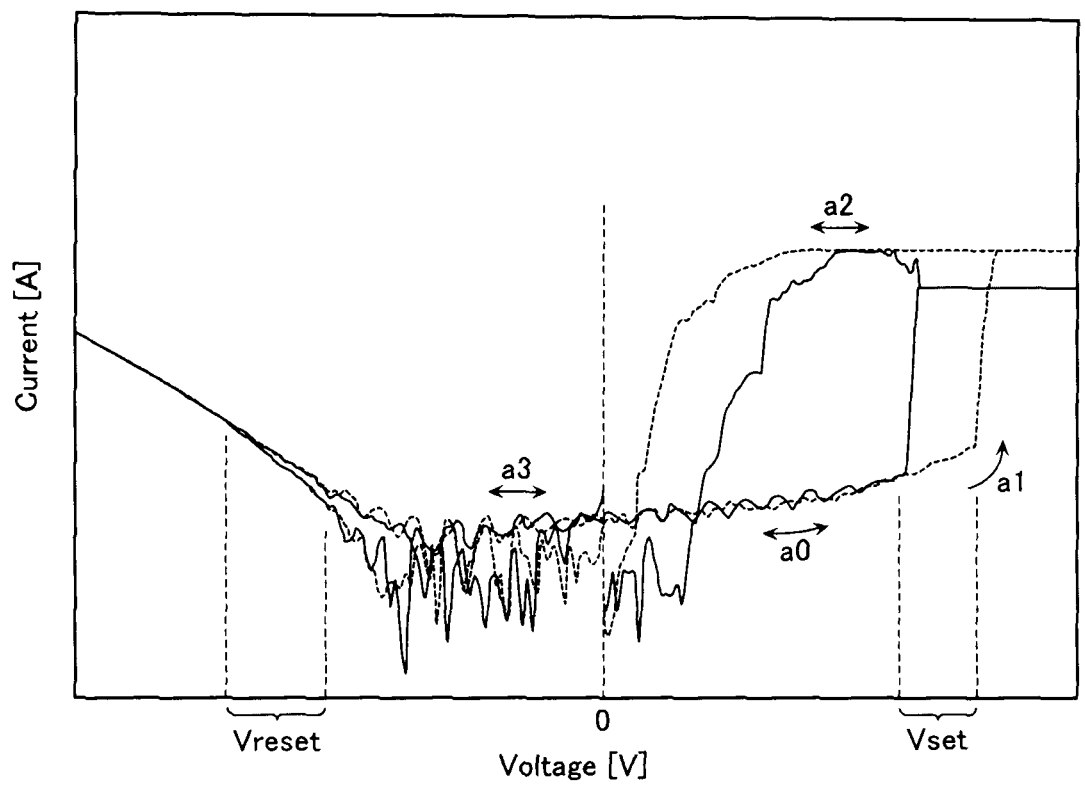
FIG. 4 is a diagram for describing a current-voltage characteristic of a variable resistor VR.

FIG. 2 is a partial perspective view illustrating a part of the memory cell array 1, and FIG. 3 is a cross-sectional view, taken along line I-I' of FIG. 2, corresponding to one memory cell viewed in an arrow direction. Word lines WL0 to WL2 are arranged parallel to each other as a plurality of first lines, and bit lines BL0 to BL2 are arranged parallel to each other as a plurality of second lines crossing the first lines. A memory cell MC is arranged at each crossing point of both lines to be interposed therebetween. The first and second lines are preferably made of a material that is heat-resistant and has a low resistance value such as W, WSi, NiSi, and CoSi. In FIGS. 2 to 4, only three word lines WL and three bit lines BL are illustrated, however, it goes without saying that four or more word lines WL and four or more bit lines BL may be arranged in one memory cell array.

[Memory Cell MC]

For example, a memory cell MC is configured with a series connection circuit of a variable resistor VR and a diode DI as illustrated in FIG. 3. Each of electrodes EL1 to EL3 may be made of an electrode material such as Pt, Au, Ag, TiAlN, SrRuO, Ru, RuN, Ir, Co, Ti, TiN, TaN, LaNiO, Al, PtIrO$_x$, PtRhO$_x$, Rh, TaAlN, and W. Further, a metal film for making orientation uniform may be interposed. Furthermore, a buffer layer, a barrier metallic layer, an adhesive layer, and the like may be interposed.

[Diode DI]

In the memory cell MC, when the variable resistor VR is connected with the diode DI in series, the memory cell MC has a rectifying function. For example, a PN junction diode including a p type layer and an n type layer may be used as the diode DI. Besides the PN junction diode, various diodes such as a Schottky diode and a PIN diode may be used as the diode DI. Further, when the variable resistor VR has a rectifying function therein, the diode DI may not be provided.

[Variable Resistor VR]

The variable resistor VR changes its resistance value by a current, heat, chemical energy, or the like, which is generated by application of a voltage. Examples of the variable resistor VR include a phase change memory element that changes a resistance value according to a change between crystalline and amorphous states of a chalcogenide compound, a magneto-resistive memory element (MRAM) using a resistance change by a tunnel magneto-resistance effect, a conductive-bridging memory element (CBRAM) having a characteristic of a solid electrolyte, a memory element of a polymeric ferroelectric RAM (PFRAM) including a resistive element made of a conductive polymer, and a ReRAM element in which a resistance value changes according to application of a voltage.

A ReRAM element in which a resistance value changes according to application of a voltage will be described as an example of the variable resistor VR. FIG. 4 is a diagram illustrating a current-voltage characteristic of a ReRAM element in which a resistance value changes according to application of a voltage. The variable resistor VR stores data according to different resistance states. Hereinafter, a state of the memory cell MC when the variable resistor is in a high resistance state is referred to as a "reset state", and a state of the memory cell MC when the variable resistor is in a low resistance state is referred to as a "set state". Further, an operation to change the memory cell MC from the reset state to the set state is referred to as a "set operation", and an operation to change the memory cell MC from the set state to the reset state is referred to as a "reset operation". The variable resistor VR has a characteristic in which a current-voltage characteristic becomes asymmetric according to a direction of an applied voltage as illustrated in FIG. 4, and has a rectifying function.

When a voltage is applied to the memory cell MC of the reset state in a forward direction, in a range in which the applied voltage is from near 0 V to a set voltage Vset, the memory cell MC remains in the reset state, and a cell current flowing through the memory cell MC reversibly changes according to a change in the applied voltage (arrow a0). Then, when the applied voltage is equal to or higher than the set voltage Vset, the state of the memory cell MC irreversibly transitions from the reset state to the set state (set operation) (arrow a1). A value of the set voltage Vset that causes transition from the reset state to the set state differs according to the variable resistor VR.

Meanwhile, when a voltage is applied to the memory cell MC of the set state in the forward direction, the cell current flowing through the memory cell MC reversibly changes according to a change in the applied voltage (arrow a2). However, as long as a voltage is applied in the forward direction, the memory cell MC of the set state does not transition to the reset state even though the applied voltage increases.

When a voltage is applied to the memory cell MC of the set state in a reverse direction, in a range in which the applied voltage is from 0 V to a reset voltage Vreset, the memory cell MC remains in the set state, and the cell current flowing to the memory cell MC reversibly changes according to a change in the applied voltage (arrow a3). Then, when the applied voltage is equal to or lower than the reset voltage Vreset, the state of the memory cell MC irreversibly transitions from the set state to the reset state (reset operation). A value of the reset voltage Vreset that causes transition from the set state to the reset state differs according to the variable resistor VR.

Meanwhile, when a voltage is applied to the memory cell MC of the reset state in the reverse direction, the cell current flowing through the memory cell MC reversibly changes according to a change in the applied voltage (arrow a3). However, as long as a voltage is applied in the reverse direction, the memory cell MC of the reset state does not transition to the set state even though the applied voltage increases.

[Exemplary Modification of Memory Cell Array]

Figure 5:
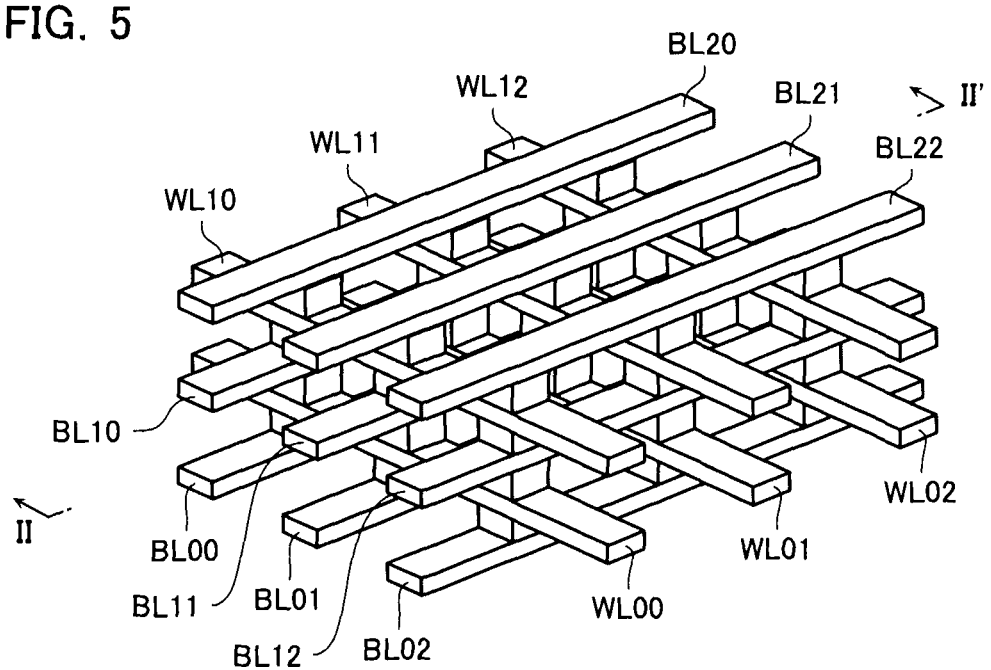
FIG. 5 illustrates another configuration example of a memory cell array 1.
Figure 6:
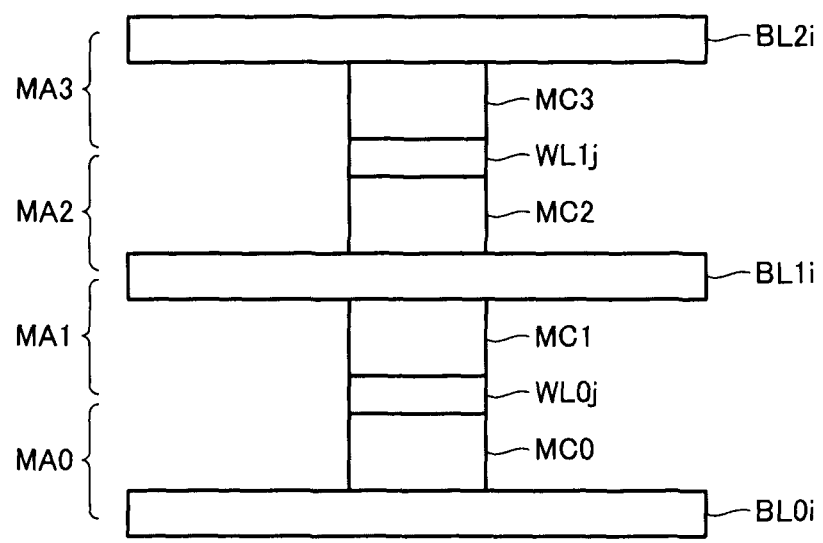
FIG. 6 illustrates another configuration example of a memory cell array 1.

A three-dimensional structure may be provided such that a plurality of above-described memory structures are stacked as illustrated in FIG. 5. FIG. 6 is a cross-sectional view taken along line II-II' of FIG. 5. In this example, in a memory cell array having a four-layer structure including cell array layers MA0 to MA3, a word line WL0$j$ is shared between memory cells MC0 and MC1 therebelow and thereabove, a bit line BL1$i$ is shared between memory cells MC1 and MC2 therebelow and thereabove, and a word line WL1$j$ is shared between memory cell MC2 and MC3 therebelow and thereabove.

Further, an interlayer insulating film may be interposed between the cell array layers in the form of line/cell/line/interlayer insulating film/line/cell/line rather than repetition of line/cell/line/cell. The memory cell array 1 may be divided into several memory cell groups MAT. The column control circuit 2 and the row control circuit 3 may be provided for each memory cell group MAT or for each cell array layer MA or may be shared between the memory cell groups MAT or the cell array layers MA. Further, the column control circuit 2 may be shared among a plurality of bit lines BL so as to reduce the area size.

[Memory Cell Array and Peripheral Circuit Thereof]

Figure 7:
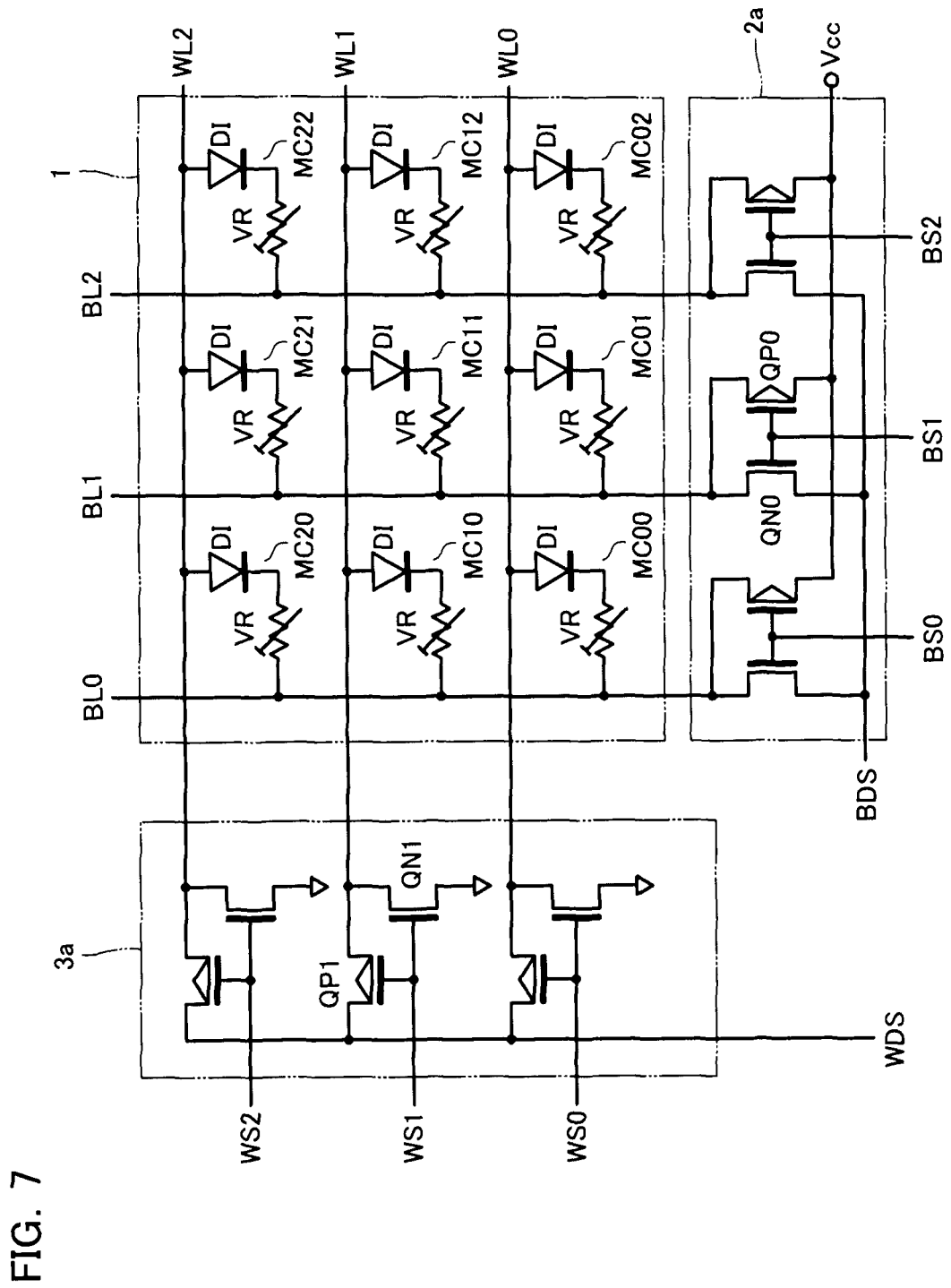
FIG. 7 is a circuit diagram illustrating a memory cell array 1 and a peripheral circuit thereof.

FIG. 7 is a circuit diagram illustrating the memory cell array 1 and a peripheral circuit thereof. Here, for simplification of description, a description will be made using one layer of a stacked structure as an example. FIG. 7 illustrates an example in which the memory cell MC is configured by the variable resistor VR and the diode DI connected in series. However, as described above, when the variable resistor VR has a rectifying function therein, the diode DI may not be provided. In FIG. 7, the diode DI configuring the memory cell MC has an anode connected to a word line WL and a cathode connected to a bit line BL through the variable resistor VR. One end of each word line WL is connected to a selecting circuit 3$a$ which is a part of the row control circuit 3. Further, one end of each bit line BL is connected to a selecting circuit 2$a$ which is a part of the column control circuit 2.

The selecting circuit 3$a$ includes a selecting PMOS transistor QP1 and a selecting NMOS transistor QN1 which are provided for each word line WL. A gate and a drain of the selecting PMOS transistor QP1 are commonly connected with a gate and a drain of the selecting NMOS transistor QN1, respectively. A source of the selecting PMOS transistor QP1 is connected to a word line side drive sense line WDS through which a write pulse is applied and through which a current to be detected at the time of data read flows. A source of the selecting NMOS transistor QN1 is connected to a low potential power voltage Vss. A common drain of the transistors QP1 and QN1 is connected to the word line WL, and a common gate thereof is supplied with a word line selecting signal WSi (i=0 to 2) for selecting each word line WL.

The selecting circuit 2$a$ includes a selecting PMOS transistor QP0 and a selecting NMOS transistor QN0 which are provided for each bit line BL. A gate and a drain of the selecting PMOS transistor QP0 are commonly connected with a gate and a drain of the selecting NMOS transistor QN0, respectively. A source of the selecting PMOS transistor QP0 is connected to a high potential power voltage Vcc. A source of the selecting NMOS transistor QN0 is connected to a bit line side drive sense line BDS through which a write pulse is applied and through which a current to be detected at the time of data read flows. A common drain of the transistors QP0 and QN0 is connected to the bit line BL, and a common gate thereof is supplied with a bit line selecting signal BSi (i=0 to 2) for selecting each bit line BL.

[Operation of Non-volatile Semiconductor Memory Device]

Figure 8:
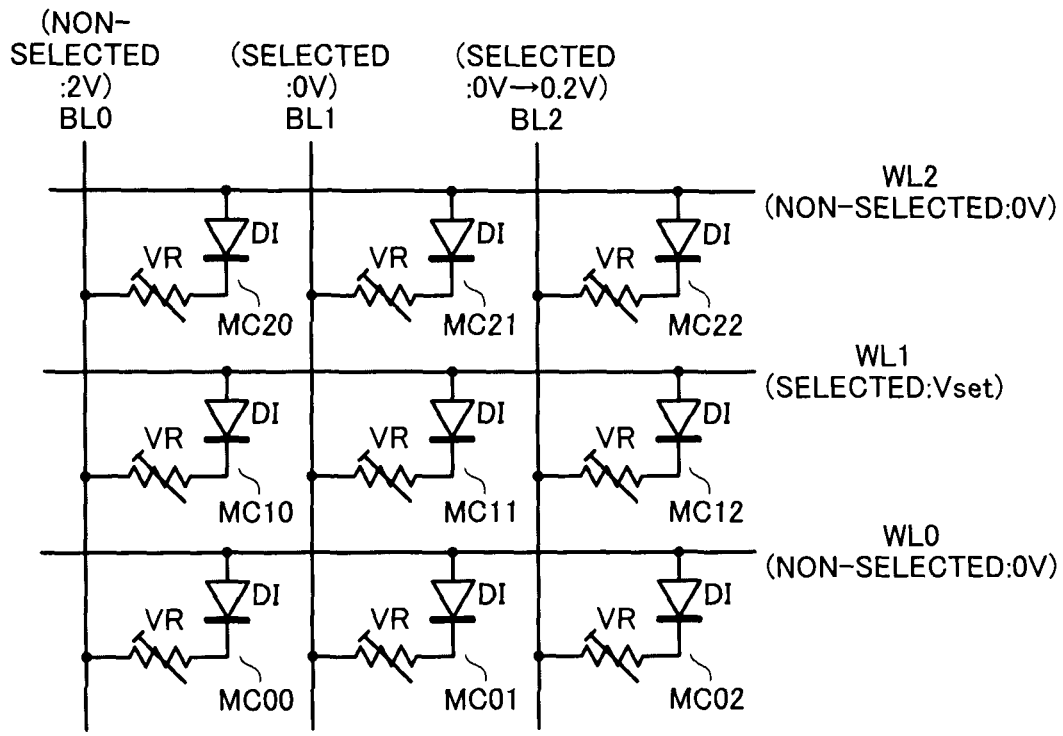
FIG. 8 is a circuit diagram for describing an operation of a non-volatile semiconductor memory device according to a first embodiment.
Figure 9:
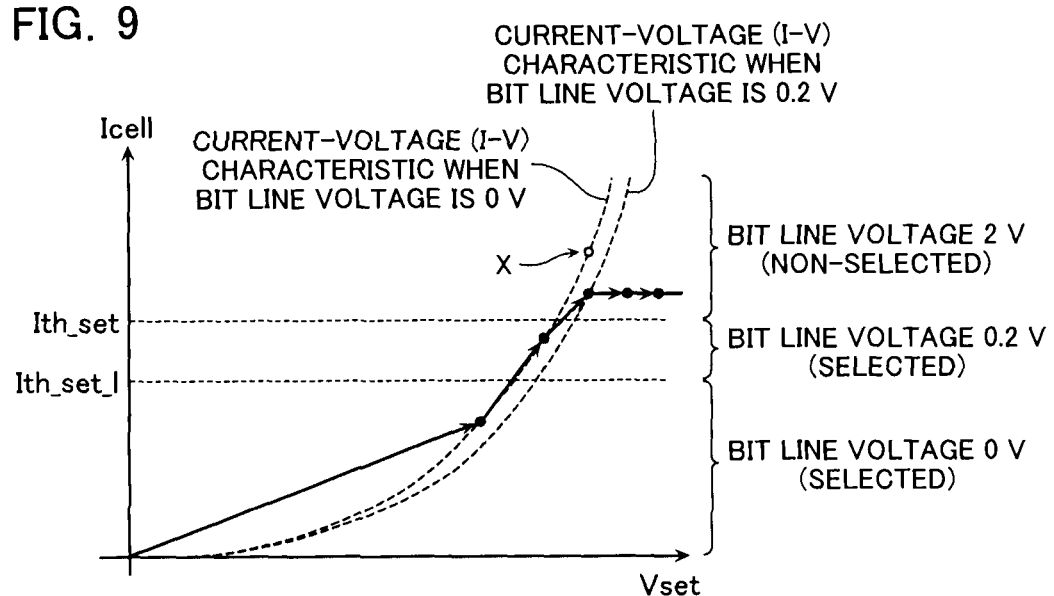
FIG. 9 is a diagram for describing an operation characteristic of the non-volatile semiconductor memory device according to the first embodiment.
Figure 10:
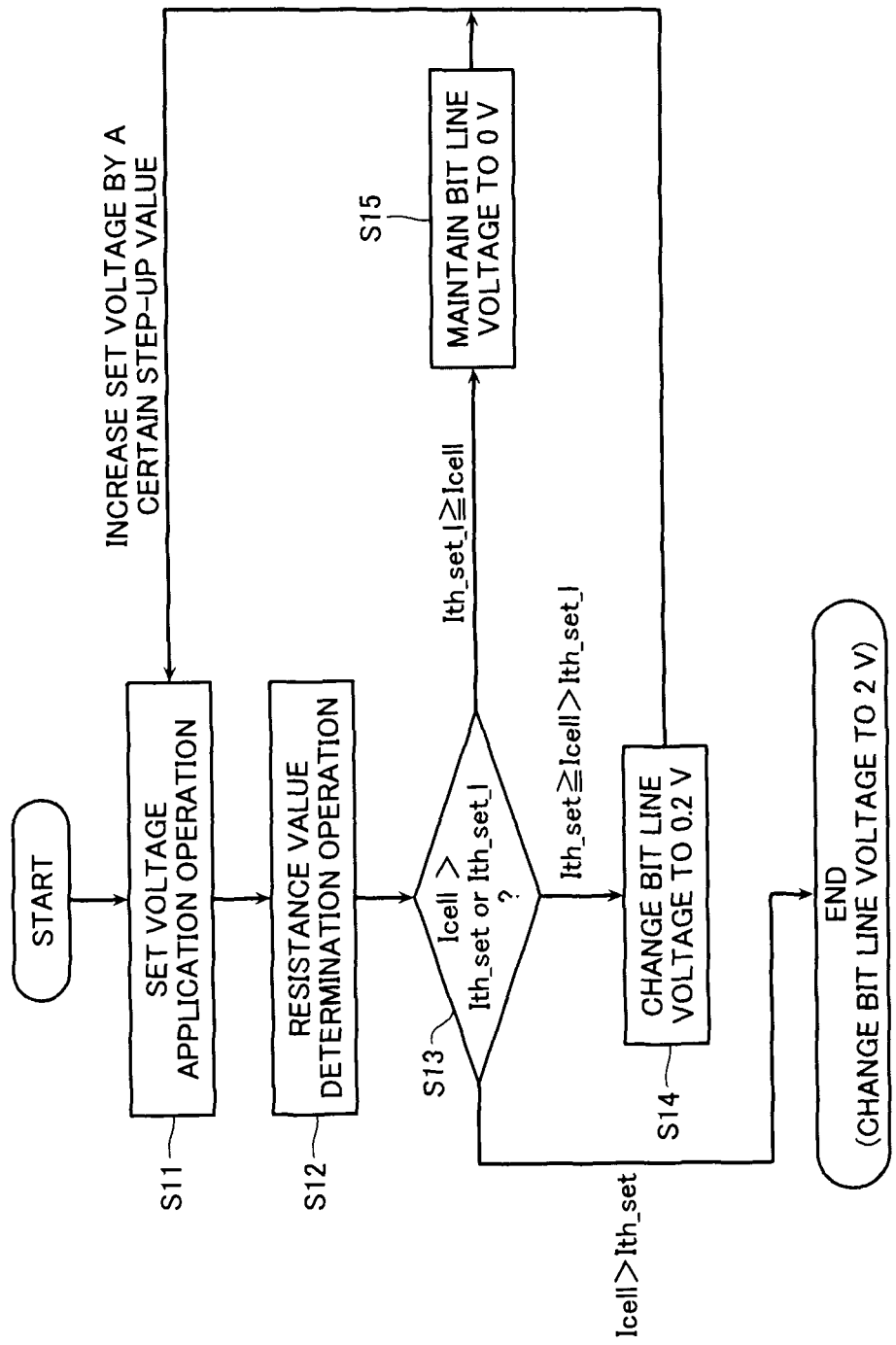
FIG. 10 is a flowchart for describing an operation of a non-volatile semiconductor memory device according to the first embodiment.

Next, a set operation of a non-volatile semiconductor memory device according to the present embodiment will be described. FIG. 8 is a diagram illustrating voltages applied to a word line WL and a bit line BL at the time of the set operation of the non-volatile semiconductor memory device according to the present embodiment. FIG. 9 is a diagram illustrating a current-voltage characteristic of a memory cell MC during the set operation of the non-volatile semiconductor memory device according to the present embodiment. FIG. 10 is a flowchart for describing the set operation of a non-volatile semiconductor memory device according to the present embodiment.

First, a set voltage application operation is performed to the selected memory cell MC (step S11 of FIG. 10). As described above, the set operation is performed by applying a set voltage Vset to the memory cell MC of the high resistance state (reset state). FIG. 8 illustrates an example in which a word line WL1 and bit lines BL1 and BL2 are selected, and the set operation is performed on memory cells MC11 and MC12. As illustrated in FIG. 8, the set voltage Vset is applied to the selected word line WL1, and a non-selected word line voltage (for example, 0 V) is applied to non-selected word lines WL0 and WL2. A selected bit line voltage (for example, 0 V) is applied to the selected bit lines BL1 and BL2, and a non-selected bit line voltage (for example, 2 V) is applied to a non-selected bit line BL0.

Next, a resistance value determination operation is performed to the selected memory cell MC (step S12 of FIG. 10). Through the voltage application operation illustrated in FIG. 8, the set voltage Vset is applied to the selected memory cells MC11 and MC12. As a result, the resistance value of the variable resistor VR changes. The selected memory cell MC is determined whether or not the resistance value has been decreased up to a certain value through the resistance value determination operation performed after the set voltage Vset is applied. For example, a sense amplifier provided in the column control circuit 2 is used for the resistance value determination operation of the selected memory cell MC. In the resistance value determination operation of the selected memory cell MC, it can be determined whether a cell current Icell flowing to the bit line BL through the selected memory cell MC is larger than a determination value Ith_set when a certain voltage is applied to the selected memory cell MC. The selected memory cell MC through which the cell current Icell larger than the determination value Ith_set flows is determined as the variable resistor VR has transitioned to the low resistance state (set state). In this case, the set operation to the selected memory cell MC is finished (step S13 of FIG. 10).

In the set operation according to the present embodiment, when the resistance value of the selected memory cell MC has changed up to a certain value, a voltage value applied to the selected bit line BL is changed. FIG. 8 illustrates an example in which the resistance value of the selected memory cell MC12 has changed up to a certain value, and so the voltage of the selected bit line BL2 is changed (for example, from 0 V to 0.2 V).

Next, a condition for changing a voltage value applied to the selected bit line BL will be described with reference to FIG. 9. In FIG. 9, a horizontal axis represents a voltage value of the set voltage Vset, and a vertical axis represents a value of the cell current Icell flowing to the bit line BL when the resistance value determination operation of the selected memory cell MC is performed. Dots of FIG. 9 represent a relation between the values of the set voltage Vset which are applied a plurality of times and the current value Icell flowing through the selected memory cell MC at the resistance value determination operation of the selected memory cell MC.

During the set operation, as the set voltage Vset is applied, the resistance values of the selected memory cells MC11 and MC12 decrease. As illustrated in FIG. 9, when the set voltage Vset is applied to the selected word line WL1 and a voltage of 0 V is applied to the selected bit lines BL1 and BL2, the resistance values of the selected memory cells MC11 and MC12 change according to the current-voltage characteristic when the bit line voltage is 0 V, and the value of the cell current Icell changes. As described above, in the resistance value determination operation of the selected memory cell MC, when the value of the cell current Icell is larger than a certain determination value Ith_set, it is determined that the resistance state of the selected memory cell MC has transitioned to the low resistance state, and so the set operation ends.

In the resistance value determination operation of the selected memory cell MC according to the present embodiment, the determination value Ith_set_l (Ith_set_l<Ith_set) is set in addition to the determination value Ith_set. In the set operation according to the present embodiment, when the cell current Icell is larger than the determination value Ith_set_l and is equal to or smaller than the determination value Ith_set during the resistance value determination operation of the selected memory cell MC, the bit line voltage is changed from 0 V to 0.2 V (steps S13 and S14 of FIG. 10).

When the voltage of the selected bit line BL2 is changed to 0.2 V as illustrated in FIG. 8, a voltage which is 0.2 V smaller than the set voltage Vset is applied to the selected memory cell MC12 during a subsequent application operation of the set voltage Vset. In this case, the resistance value of the selected memory cell MC12 and the value of the cell current Icell change according to the current-voltage characteristic when the bit line voltage is 0.2 V, which is illustrated in FIG. 9.

In the set operation according to the present embodiment, when the cell current Icell is equal to or smaller than the determination value Ith_set_l during the resistance value determination operation of the selected memory cell MC, the bit line voltage is maintained to 0 V (steps S13 and S15 of FIG. 10).

A described above, in the set operation according to the present embodiment, a value of a voltage applied to the bit line BL is selected from among a plurality of different voltage values and changed based on the current value flowing through the selected memory cell MC during the resistance value determination operation of the selected memory cell MC.

Further, a voltage value of the set voltage Vset may be changed each time when an application operation is repeated. For example, when the resistance value of the variable resistor VR of the selected memory cell MC has not changed up to a certain value even though the set voltage Vset is applied a certain number of times, the voltage value of the set voltage Vset may be increased by a certain step-up value, and then the set voltage Vset may be applied again.

[Effects]

As illustrated in FIG. 9, when the value of the cell current Icell at the resistance value determination operation of the selected memory cell MC is larger than the determination value Ith_set_l and is equal to or smaller than the determination value Ith_set, the selected memory cell MC is in a state immediately before transitioning to the set state. At this time, when the bit line voltage is set to 0 V and then the set voltage Vset is applied, the resistance value changes according to the current-voltage characteristic when the bit line voltage is 0 V, and the value of the cell current Icell of the selected memory cell after the set operation is much larger than the determination value Ith_set (a symbol X of FIG. 9). When the set operation is completed, the resistance values of the variable resistors VR are significantly different in the memory cell MC in which the value of the cell current Icell flowing to the memory cell MC is near the determination value Ith_set and in the memory cell MC in which the value of the cell current Icell flowing to the memory cell MC is much larger than the determination value Ith_set, and thus a problem is likely to occur during a subsequent data read operation.

However, the non-volatile semiconductor memory device according to the present embodiment changes the value of the voltage applied to the bit line BL when the value of the cell current Icell at the resistance value determination operation of the selected memory cell MC is larger than the determination value Ith_set_l and is equal to or smaller than the determination value Ith_set. As a result, during a next application operation of the set voltage Vset, the resistance value of the selected memory cell MC changes according to the current-voltage characteristic when the bit line voltage is 0.2 V, and the value of the cell current Icell does not significantly change. Thus, when the set operation is completed, the cell current Icell flowing through the memory cell MC is not much larger than the determination value Ith_set. Accordingly, the non-volatile semiconductor memory device according to the present embodiment can suppress dispersion in the resistance values of the variable resistors VR after the set operation.

Second Embodiment

Next, a non-volatile semiconductor memory device according to a second embodiment will be described with reference to FIGS. 11 to 13. An entire configuration of the non-volatile semiconductor memory device according to the present embodiment is the same as in the first embodiment, and thus the detailed description thereof will be omitted. Further, components having the same configuration as in the first embodiment are denoted by the same reference numerals, and thus the redundant description thereof will be omitted.

The non-volatile semiconductor memory device according to the second embodiment is different from the first embodiment in the number of determination values for changing the voltage of the selected bit line BL.

Figure 11:
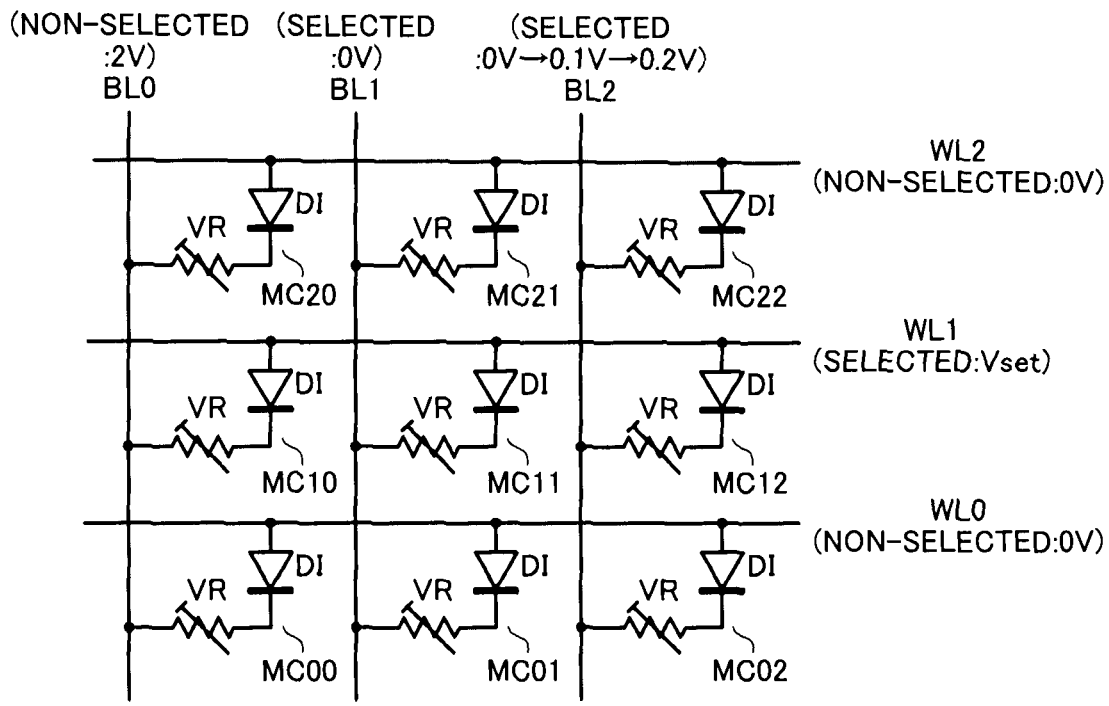
FIG. 11 is a circuit diagram for describing an operation of a non-volatile semiconductor memory device according to a second embodiment.
Figure 12:
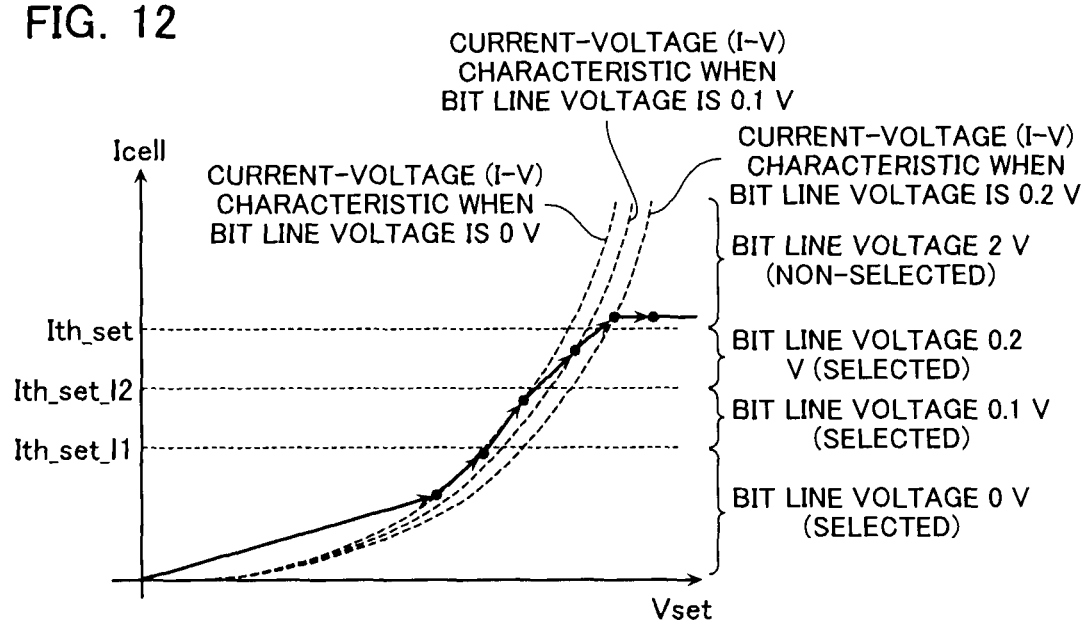
FIG. 12 is a diagram for describing an operation characteristic of the non-volatile semiconductor memory device according to the second embodiment.

FIG. 11 is a diagram illustrating voltages applied to a word line WL and a bit line BL during the set operation of the non-volatile semiconductor memory device according to the present embodiment. FIG. 12 is a diagram illustrating a current-voltage characteristic of the memory cell MC during the set operation of the non-volatile semiconductor memory device according to the present embodiment. FIG. 13 is a flowchart for describing the set operation of a non-volatile semiconductor memory device according to the present embodiment.

Figure 13:
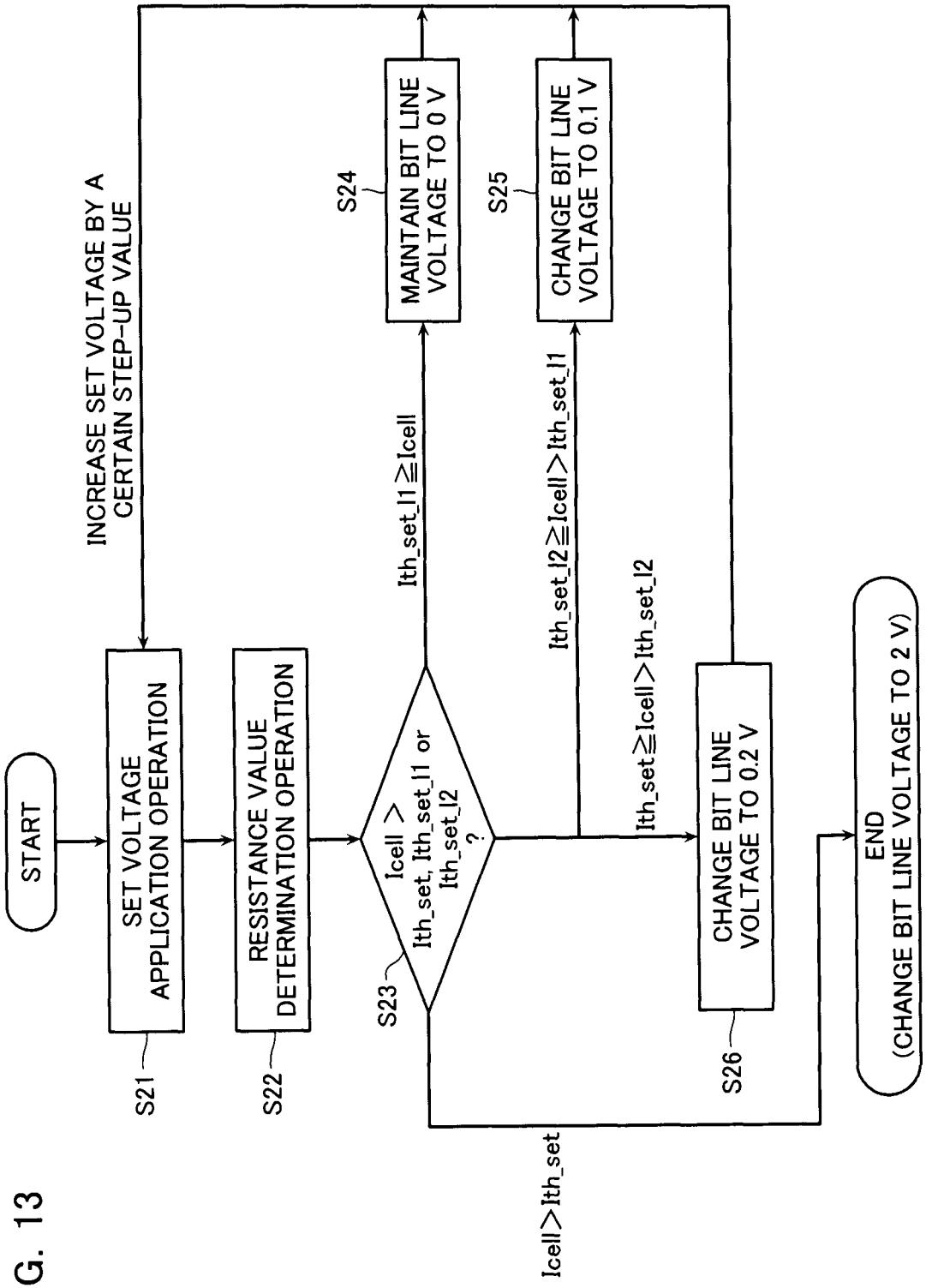
FIG. 13 is a flowchart for describing an operation of a non-volatile semiconductor memory device according to the second embodiment.

The set voltage application operation and the resistance value determination operation to the selected memory cell MC is performed as the first embodiment (steps S21 and S22 of FIG. 13).

In the set operation according to the present embodiment, when the resistance value of the selected memory cell MC changes up to a certain value, a voltage value applied to the selected bit line BL is changed. In the resistance value determination operation according to the present embodiment, a plurality of determination values are set and the bit line voltage is changed to a plurality of different voltages. FIG. 11 illustrates an example in which after the resistance value of the selected memory cell MC12 changes up to a certain value, the voltage of the selected bit line BL2 is changed (for example, from 0 V to 0.1 V), and then after the resistance value of the selected memory cell MC12 further changes, the voltage of the selected bit line BL2 is changed (for example, 0.1 V to 0.2 V).

Next, a condition for changing the voltage value applied to the selected bit line BL will be described with reference to FIG. 12. In the resistance value determination operation of the selected memory cell MC according to the present embodiment, two determination values, that is, determination values Ith_set_l1 and Ith_set_l2 are set in addition to the determination value Ith_set (here, Ith_set_l1<Ith_set_l2<Ith_set). In the set operation according to the present embodiment, when the cell current Icell at the resistance value determination operation of the selected memory cell MC is larger than the determination value Ith_set_l1 and is equal to or smaller than the determination value Ith_set_l2, the bit line voltage is changed from 0 V to 0.1 V (steps S23 and S25 of FIG. 13). Further, in the set operation according to the present embodiment, when the cell current Icell at the resistance value determination operation of the selected memory cell MC is larger than the determination value Ith_set_l2 and is equal to or smaller than the determination value Ith_set, the bit line voltage is changed to 0.2 V (steps S23 and S26 of FIG. 13).

When the voltage of the selected bit line BL2 is changed to 0.1 V or 0.2 V, a voltage which is 0.1 V or 0.2 V smaller than the set voltage Vset is applied to the selected memory cell MC12 during a subsequent application operation of the set voltage Vset. In this case, as illustrated in FIG. 12, the resistance value of the selected memory cell MC12 and the value of the cell current Icell change according to the current-voltage characteristic when the bit line voltage is 0.1 V or 0.2 V. As described above, in the set operation according to the present embodiment, a value of a voltage applied to the bit line BL is selected from among a plurality of different voltage values and changed based on the current value flowing through the selected memory cell MC during the resistance value determination operation of the selected memory cell MC.

In the set operation according to the present embodiment, when the cell current Icell is equal to or smaller than the determination value Ith_set_l1 during the resistance value determination operation of the selected memory cell MC, the bit line voltage is maintained to 0 V (steps S23 and S24 of FIG. 13).

[Effects]

The non-volatile semiconductor memory device according to the present embodiment changes the value of the voltage applied to the bit line BL when the value of the cell current Icell at the time of the resistance value determination operation of the selected memory cell MC is larger than the determination value Ith_set_l1 or the determination value Ith_set_l2. As a result, the voltage applied to the selected memory cell MC can be reduced according to a reduction in the resistance value of the selected memory cell MC. Thus, when the set operation is completed, the cell current Icell flowing to the memory cell MC is not much larger than the determination value Ith_set. Accordingly, the non-volatile semiconductor memory device according to the present embodiment can suppress dispersion in the resistance values of the variable resistors VR after the set operation.

Third Embodiment

Next, a non-volatile semiconductor memory device according to a third embodiment will be described with reference to FIGS. 14 to 16. An entire configuration of the non-volatile semiconductor memory device according to the present embodiment is the same as in the first embodiment, and thus the detailed description thereof will be omitted. Further, components having the same configuration as in the first embodiment are denoted by the same reference numerals, and thus the redundant description thereof will be omitted.

The first and second embodiments have been described in association with a voltage application operation at the set operation. In contrast, the present embodiment will be described in association with a voltage application operation at the reset operation.

[Operation of Non-volatile Semiconductor Memory Device]

A reset operation of the non-volatile semiconductor memory device according to the present embodiment will be described. FIG. 14 is a diagram illustrating voltages applied to a word line WL and a bit line BL during the reset operation of the non-volatile semiconductor memory device according to the present embodiment. FIG. 15 is a diagram illustrating a current-voltage characteristic of the memory cell MC during the reset operation of the non-volatile semiconductor memory device according to the present embodiment. FIG. 16 is a flowchart for describing the reset operation of a non-volatile semiconductor memory device according to the present embodiment.

Figure 16:
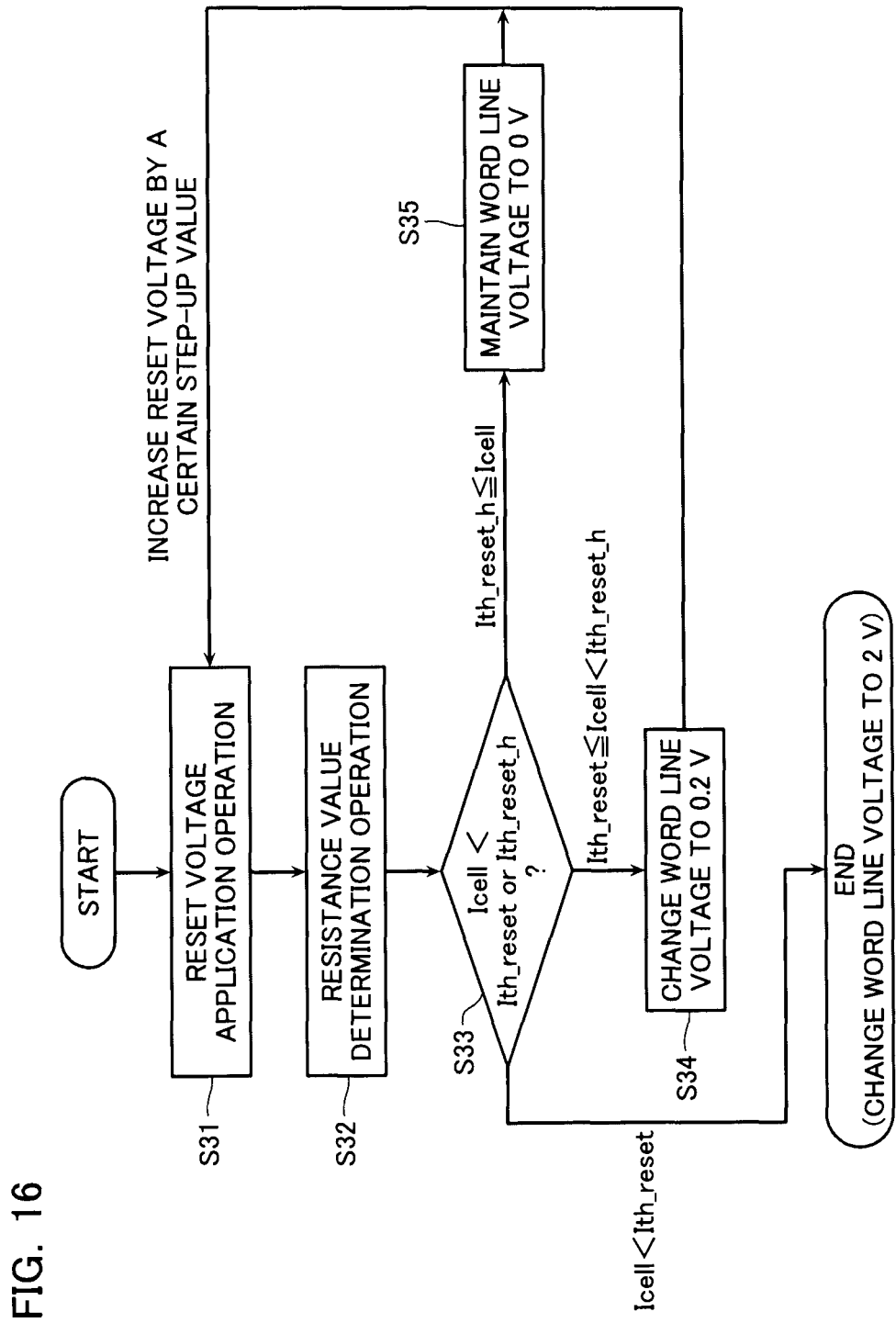
FIG. 16 is a flowchart for describing an operation of a non-volatile semiconductor memory device according to the third embodiment.

First, a reset voltage application operation is performed to the selected memory cell MC (step S31 of FIG. 16). As described above, the reset operation is performed by applying the reset voltage Vreset to the memory cell MC of the low resistance state (set state) in a direction opposite to the set voltage. FIG. 14 illustrates an example in which a bit line BL1 and word lines WL0 and WL1 are selected, and the reset operation is performed on memory cells MC11 and MC01. As illustrated in FIG. 14, a reset voltage Vreset is applied to the selected bit line BL1, and a non-selected bit line voltage (for example, 1 V) is applied to non-selected bit lines BL0 and BL2. Further, a selected word line voltage (for example, 0 V) is applied to the selected word lines WL0 and WL1, and a non-selected word line voltage (for example, 2 V) is applied to a non-selected word line WL2.

Next, a resistance value determination operation is performed to the selected memory cell MC (step S32 of FIG. 16). Through the voltage application operation illustrated in FIG. 14, the reset voltage Vreset is applied to the selected memory cells MC11 and MC01 in a reverse bias direction of a diode DI. As a result, the resistance value of the variable resistor VR changes. The selected memory cell MC is determined whether or not the resistance value has been increased up to a certain value through the resistance value determination operation performed after the reset voltage Vreset is applied.

In the resistance value determination operation of the selected memory cell MC, it can be determined whether or not the cell current Icell flowing to the bit line BL through the selected memory cell MC is smaller than a determination value Ith_reset when a certain voltage is applied to the selected memory cell MC. When the cell current Icell is smaller than the determination value Ith_reset, the selected memory cell MC is determined that the variable resistor VR has transitioned to the high resistance state (reset state). In this case, the reset operation to the selected memory cell MC is finished (step S33 of FIG. 16).

In the reset operation according to the present embodiment, when the resistance value of the selected memory cell MC has changed up to a certain value, a voltage value applied to the selected word line WL is changed. FIG. 14 illustrates an example in which the resistance value of the selected memory cell MC01 has changed up to a certain value, and so the voltage of the selected word line WL0 is changed (for example, from 0 V to 0.2 V).

Next, a condition for changing a voltage value applied to the selected word line WL will be described with reference to FIG. 15. During the reset operation, as the reset voltage Vreset is applied, the resistance values of the selected memory cells MC11 and MC01 increase. As illustrated in FIG. 15, when the reset voltage Vreset is applied to the selected bit line BL1 and a voltage of 0 V is applied to the selected word lines WL1 and WL0, the resistance values of the selected memory cells MC11 and MC01 and the value of the cell current Icell change according to a current-voltage characteristic when the word line voltage is 0 V. As described above, in the resistance value determination operation of the selected memory cell MC, when it is determined that the value of the cell current Icell is smaller than a certain determination value Ith_reset, it is determined that the resistance state of the selected memory cell MC has transitioned to the high resistance state, and so the reset operation ends.

Here, in the resistance value determination operation of the selected memory cell MC according to the present embodiment, a determination value Ith_reset_h (Ith_reset<Ith_reset_h) is set in addition to the determination value Ith_reset. In the reset operation according to the present embodiment, when the cell current Icell is smaller than the determination value Ith_reset_h and is equal to or larger than the determination value Ith_reset during the resistance value determination operation of the selected memory cell MC, the word line voltage is changed from 0 V to 0.2 V (steps S33 and S34 of FIG. 16).

Figure 14:
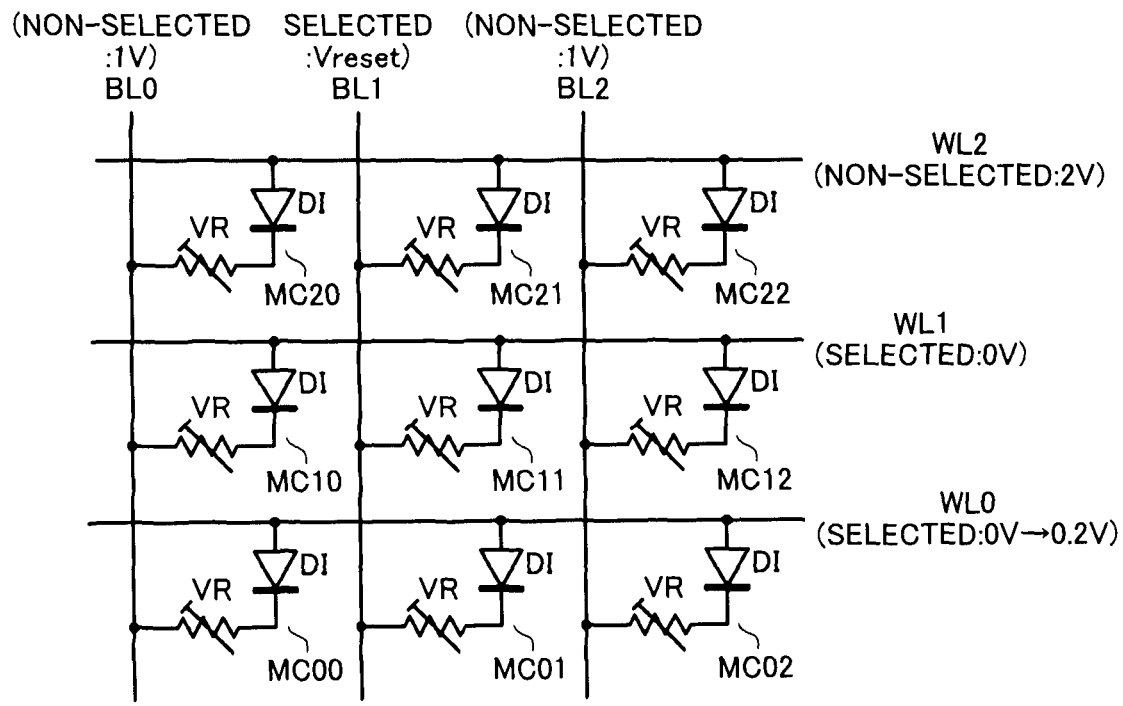
FIG. 14 is a circuit diagram for describing an operation of a non-volatile semiconductor memory device according to a third embodiment.
Figure 15:
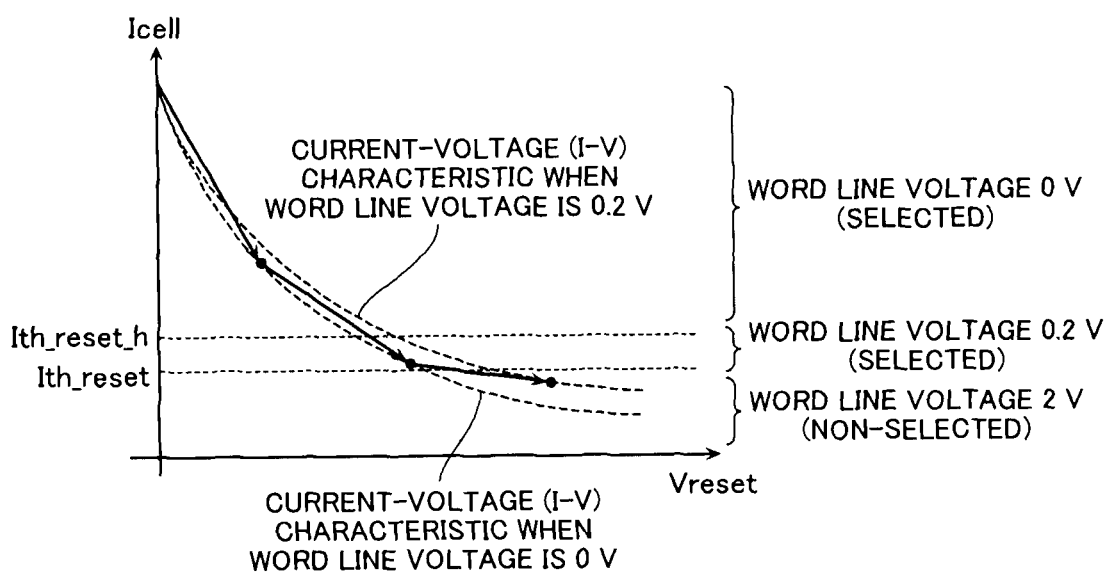
FIG. 15 is a diagram for describing an operation characteristic of the non-volatile semiconductor memory device according to the third embodiment.

When the voltage of the selected word line WL0 is changed to 0.2 V as illustrated in FIG. 14, a voltage which is 0.2 V smaller than the reset voltage Vreset is applied to the selected memory cell MC01 during a subsequent application operation of the reset voltage Vreset. In this case, the resistance value of the selected memory cell MC01 and the value of the cell current Icell change according to the current-voltage characteristic when the word line voltage is 0.2 V, which is illustrated in FIG. 15.

In the reset operation according to the present embodiment, when the cell current Icell is equal to or larger than the determination value Ith_set_h during the resistance value determination operation of the selected memory cell MC, the bit line voltage is maintained to 0 V (steps S33 and S35 of FIG. 16).

As described above, in the reset operation according to the present embodiment, a value of a voltage applied to the word line WL is selected from among a plurality of different voltage values and changed based on the current value flowing to the selected memory cell MC during the resistance value determination operation of the selected memory cell MC.

Further, a voltage value of the reset voltage Vreset may be changed each time when an application operation is repeated. For example, when the resistance value of the variable resistor VR of the selected memory cell MC has not changed up to a certain value even though the reset voltage Vreset is applied a certain number of times, the voltage value of the reset voltage Vreset may be increased by a certain step-up value, and then the reset voltage Vreset may be applied again.

[Effects]

The non-volatile semiconductor memory device according to the present embodiment changes the value of the voltage applied to the word line WL when the value of the cell current Icell at the resistance value determination operation of the selected memory cell MC is smaller than the determination value Ith_reset_h and is equal to or larger than the determination value Ith_reset. As a result, during a next application operation of the reset voltage Vreset, the resistance value of the selected memory cell MC changes according to the current-voltage characteristic when the word line voltage is 0.2 V. The value of the cell current Icell does not significantly change. Thus, when the reset operation is completed, the cell current Icell flowing through the memory cell MC is not much smaller than the determination value Ith_reset. Accordingly, the non-volatile semiconductor memory device according to the present embodiment can suppress dispersion in the resistance values of the variable resistors VR after the reset operation.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Figure 17:
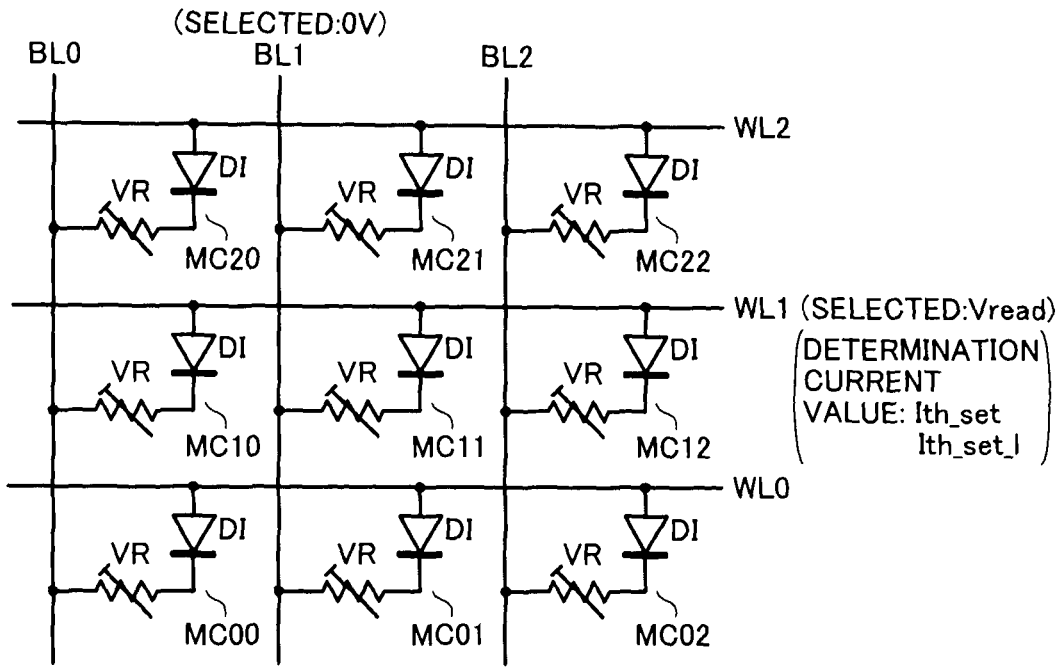
FIG. 17 is a circuit diagram for describing an operation of a non-volatile semiconductor memory device according to an embodiment.

For example, in the above embodiments, the resistance value determination operation of the selected memory cell MC is performed based on the value of the cell current Icell that flows when a certain voltage is applied. FIG. 17 is a diagram illustrating voltages applied to a word line WL1 and a bit line BL1 during a resistance value determination operation of a non-volatile semiconductor memory device according to an embodiment. For example, in order to determine whether or not the cell current Icell is larger than the determination value Ith_set_l or the determination value Ith_set as in the first embodiment, a read voltage Vread is applied to the selected word line WL1, and a voltage of 0 V is applied to the selected bit line BL1. At this time, it can be determined whether or not the current value of the cell current Icell flowing through the selected memory cell MC11 is larger than the determination value Ith_set_l or the determination value Ith_set using a decoder provided in the row control circuit 3.

Figure 18:
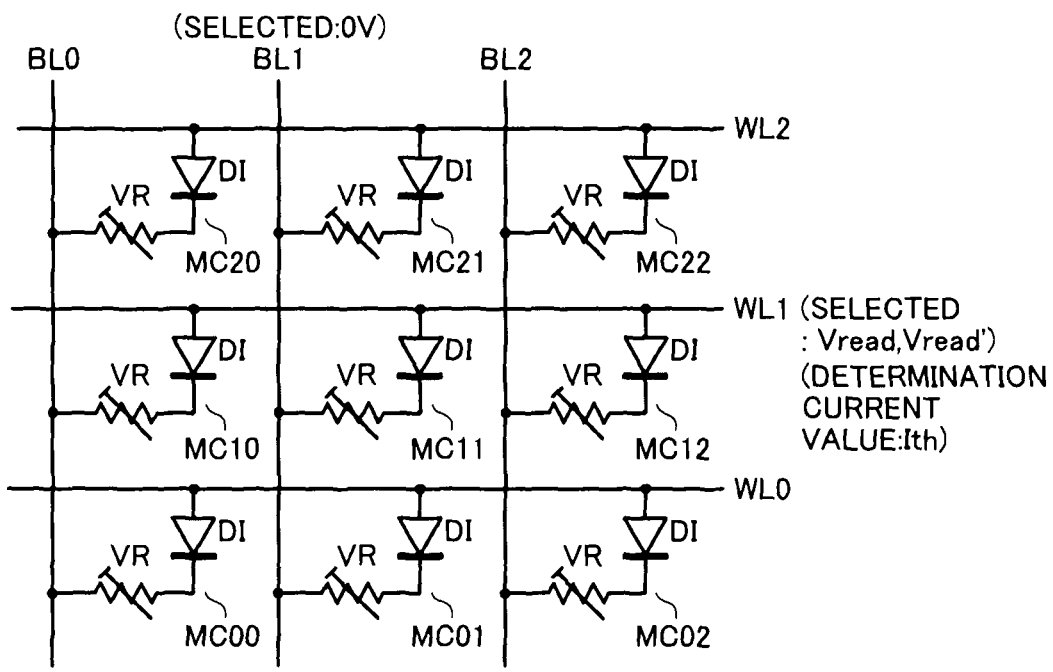
FIG. 18 is a circuit diagram for describing an operation of a non-volatile semiconductor memory device according to an embodiment.

Further, in the resistance value determination operation of the selected memory cell MC, two types of read voltages are prepared, and the resistance value state of the selected memory cell MC may be determined using a determination current value of a fixed value. FIG. 18 is a diagram illustrating voltages applied to a selected word line WL1 and a selected bit line BL1 during the resistance value determination operation of the non-volatile semiconductor memory device in this case. A read voltage Vread or a read voltage Vread' (Vread≠Vread') is applied to the selected word line WL1, and a voltage of 0 V is applied to the selected bit line BL1. The resistance value of the selected memory cell MC may be determined by detecting whether or not the current value of the cell current Icell flowing through the selected memory cell MC11 is larger than the determination value Ith when the read voltages Vread and Vread' are applied, respectively. FIG. 18 illustrates an example of changing only the read voltage applied to the selected word line WL1. However, a voltage applied to the selected memory cell MC11 can be changed by changing either or both of the selected word line WL1 and the selected bit line BL1.

The above described resistance value determination operation may be performed at any of a negative voltage and a positive voltage. Of the negative voltage and the positive voltage, a voltage suitable for device characteristics and the like may be appropriately selected.

What is claimed is:

1. A non-volatile semiconductor memory device, comprising:
    a memory cell array including first lines, second lines, and memory cells each including a variable resistor and each connected between one of the first lines and one of the second lines; and
    a control circuit configured to perform a voltage application operation of applying a first voltage to a selected first line connected to a selected memory cell and applying a second voltage having a voltage value lower than the first voltage to a selected second line connected to the selected memory cell,
    the control circuit being configured to select the voltage value of the second voltage from among a plurality of different voltage values and output the second voltage,
    wherein the control circuit is configured to perform a resistance value determination operation of reading a resistance value of the selected memory cell, the resistance value determination operation being an operation of applying a first read voltage to the selected first line, applying a second read voltage having a voltage value lower than the first read voltage to the selected second line, and comparing a cell current flowing to the selected memory cell with a certain determination value, and
    the control circuit is configured to execute the resistance value determination operation a plurality of times, changing either or both of the first read voltage and the second read voltage.

2. The non-volatile semiconductor memory device according to claim 1,
    wherein the control circuit is configured to select the voltage value of the second voltage based on a resistance value of the selected memory cell and output the second voltage.

3. A non-volatile semiconductor memory device, comprising:
    a memory cell array including first lines, second lines, and memory cells each including a variable resistor and each connected between one of the first lines and one of the second lines; and
    a control circuit configured to perform a voltage application operation of applying a first voltage to a selected first line connected to a selected memory cell and applying a second voltage having a voltage value lower than the first voltage to a selected second line connected to the selected memory cell,
    the control circuit being configured to select the voltage value of the second voltage from among a plurality of different voltage values and output the second voltage,
    wherein the control circuit is configured to perform a resistance value determination operation of reading a resistance value of the selected memory cell, the resistance value determination operation being an operation of applying a first read voltage to the selected first line, applying a second read voltage having a voltage value lower than the first read voltage to the selected second line, and comparing a cell current flowing to the selected memory cell with a certain determination value, and
    the control circuit is configured execute the resistance value determination operation a plurality of times, changing the determination value.

4. The non-volatile semiconductor memory device according to claim 1,
    wherein the control circuit increases the voltage value of the first voltage by a certain step-up value each time when the voltage application operation is performed.

5. The non-volatile semiconductor memory device according to claim 1,
    wherein the control circuit is configured to simultaneously execute the voltage application operation on a plurality of memory cells connected to one selected first line.

6. The non-volatile semiconductor memory device according to claim 1,
    wherein the variable resistor has a rectifying function.

7. A non-volatile semiconductor memory device, comprising:
    a memory cell array including first lines, second lines, and memory cells each including a variable resistor and each connected between one of the first lines and one of the second lines; and
    a control circuit configured to perform a voltage application operation of applying a first voltage to a selected first line connected to a plurality of selected memory cells and applying a second voltage having a voltage value lower than the first voltage to a plurality of selected second lines each connected to one of the selected memory cells,
    the control circuit being configured to execute the voltage application operation, changing a voltage applying state on one of the selected memory cells a plurality of times based on a resistance value of the selected memory cell,
    wherein, when the selected memory cells reach a first resistance value by the voltage application operation, the control circuit changes the voltage applying state on the selected memory cells and performs the voltage application operation again, and
    when the resistance value of some of the selected memory cells reach a second resistance value which is lower than the first resistance value, the control circuit stops the voltage application operation to some of the selected memory cells and performs the voltage application operation to others of the selected memory cells.

8. The non-volatile semiconductor memory device according to claim 7,
    wherein, when the selected memory cells reach a third resistance value by the voltage application operation, the control circuit changes the voltage applying state on the selected memory cells and performs the voltage application operation again, and
    when the resistance value of some of the selected memory cells reach a fourth resistance value which is higher than the third resistance value, the control circuit stops the voltage application operation to some of the selected memory cells and performs the voltage application operation to others of the selected memory cells.

9. The non-volatile semiconductor memory device according to claim 7,
wherein the control circuit is configured to perform a resistance value determination operation of reading a resistance value of the selected memory cell, the resistance value determination operation being an operation of applying a first read voltage to the selected first line, applying a second read voltage having a voltage value lower than the first read voltage to the selected second line, and comparing a cell current flowing to the selected memory cell with a certain determination value, and
the control circuit is configured to execute the resistance value determination operation a plurality of times, changing either or both of the first read voltage and the second read voltage.

10. The non-volatile semiconductor memory device according to claim 7,
wherein the control circuit is configured to perform a resistance value determination operation of reading a resistance value of the selected memory cell, the resistance value determination operation being an operation of applying a first read voltage to the selected first line, applying a second read voltage having a voltage value lower than the first read voltage to the selected second line, and comparing a cell current flowing to the selected memory cell with a certain determination value, and
the control circuit is configured to execute the resistance value determination operation a plurality of times, changing the determination value.

11. The non-volatile semiconductor memory device according to claim 7,
wherein the variable resistor has a rectifying function.

12. A non-volatile semiconductor memory device, comprising:
a memory cell array including first lines, second lines, and memory cells each including a variable resistor and each connected between one of the first lines and one of the second lines; and
a control circuit configured to perform a voltage application operation and a resistance value determination operation, the voltage application operation being an operation of applying a first voltage to a selected first line connected to a selected memory cell and applying a second voltage having a voltage value lower than the first voltage to a selected second line connected to the selected memory cell, the resistance value determination operation being an operation of applying a first read voltage to the selected first line, applying a second read voltage having a voltage value lower than the first read voltage to the selected second line, comparing a cell current flowing to the selected memory cell with a certain determination value, and reading a resistance value of the selected memory cell,
when a resistance value of the selected memory cell is smaller than a certain threshold value, the control circuit being configured to execute the voltage application operation, increasing the voltage value of the second voltage,
wherein the control circuit is configured to execute the resistance value determination operation a plurality of times, changing either or both of the first read voltage and the second read voltage.

13. The non-volatile semiconductor memory device according to claim 12,
wherein a plurality of values are set as the threshold value.

14. A non-volatile semiconductor memory device, comprising:
a memory cell array including first lines, second lines, and memory cells each including a variable resistor and each connected between one of the first lines and one of the second lines; and
a control circuit configured to perform a voltage application operation and a resistance value determination operation, the voltage application operation being an operation of applying a first voltage to a selected first line connected to a selected memory cell and applying a second voltage having a voltage value lower than the first voltage to a selected second line connected to the selected memory cell, the resistance value determination operation being an operation of applying a first read voltage to the selected first line, applying a second read voltage having a voltage value lower than the first read voltage to the selected second line, comparing a cell current flowing to the selected memory cell with a certain determination value, and reading a resistance value of the selected memory cell,
when a resistance value of the selected memory cell is smaller than a certain threshold value, the control circuit being configured to execute the voltage application operation, increasing the voltage value of the second voltage,
wherein the control circuit is configured to execute the resistance value determination operation a plurality of times, changing the determination value.

15. The non-volatile semiconductor memory device according to claim 12,
wherein the control circuit increases the voltage value of the first voltage by a certain step-up value each time when the voltage application operation is performed.

16. The non-volatile semiconductor memory device according to claim 12,
wherein the control circuit is configured to simultaneously execute the voltage application operation on a plurality of memory cells connected to one selected first line.

* * * * *